United States Patent
Baueregger et al.

(10) Patent No.: US 12,082,333 B2
(45) Date of Patent: Sep. 3, 2024

(54) ELECTRONIC MODULE, METHOD FOR PRODUCING AN ELECTRONIC MODULE, AND INDUSTRIAL PLANT

(71) Applicant: Siemens Aktiengesellschaft, Munich (DE)

(72) Inventors: Hubert Baueregger, Kissing (DE); Albrecht Donat, Dachsbach (DE); Axel Ganster, Schwindegg (DE); Franziska Lambrecht, Rückersdorf (DE); Markus Lasch, Munich (DE); Stefan Stegmeier, Munich (DE); Erik Weisbrod, Munich (DE); Jörg Zapf, Munich (DE)

(73) Assignee: SIEMENS AKTIENGESELLSCHAFT, Munich (DE)

( * ) Notice: Subject to any disclaimer, the term of this patent is extended or adjusted under 35 U.S.C. 154(b) by 68 days.

(21) Appl. No.: 17/801,358

(22) PCT Filed: Jan. 28, 2021

(86) PCT No.: PCT/EP2021/051899
§ 371 (c)(1),
(2) Date: Aug. 22, 2022

(87) PCT Pub. No.: WO2021/170332
PCT Pub. Date: Sep. 2, 2021

(65) Prior Publication Data
US 2023/0074572 A1   Mar. 9, 2023

(30) Foreign Application Priority Data
Feb. 28, 2020 (DE) .................... 10 2020 202 607.6
Jun. 25, 2020 (EP) ...................................... 20182203

(51) Int. Cl.
  H05K 1/02    (2006.01)
  H01L 23/367  (2006.01)
  H05K 3/34    (2006.01)

(52) U.S. Cl.
  CPC .......... H05K 1/0203 (2013.01); H01L 23/367 (2013.01); H05K 3/34 (2013.01)

(58) Field of Classification Search
  CPC ............. H05K 7/2039; H05K 7/20454; H05K 7/20463; H05K 7/20472; H05K 7/205;
  (Continued)

(56) References Cited

U.S. PATENT DOCUMENTS 5,504,651 A * 4/1996 Atarashi ............... H01L 23/467
                                                        257/722
5,672,848 A * 9/1997 Komorita ................ H01L 23/13
                                                        361/768

(Continued)

FOREIGN PATENT DOCUMENTS

| DE | 10 2009 033 029 | 1/2011 | ........... H01L 23/367 |
| EP | 2964004 A2 * | 1/2016 | ........ H01L 23/49811 |
| WO | 2009 134448 | 11/2009 | ............. C04B 37/02 |

OTHER PUBLICATIONS

EP-2964004-A2 English Translation (Year: 2016).*

(Continued)

*Primary Examiner* — Amir A Jalali
(74) *Attorney, Agent, or Firm* — Slayden Grubert Beard PLLC

(57) ABSTRACT

Various embodiments of the teachings herein include an electronic module comprising: a circuit carrier with an electrically conductive thick film with a thickness of at least 0.5 millimeter; and a plurality of thermally conductive elements connected to one another by a thermally conductive material. The thermally conductive elements have a base area with rotational symmetry.

9 Claims, 2 Drawing Sheets

(58) Field of Classification Search
CPC ........ H05K 7/2089–209; H05K 1/0201–0212;
H05K 1/021; H05K 1/029; H05K 1/032;
H05K 1/185; H05K 3/34; H05K
2201/06–068; H05K 2201/10416; H01L
23/00; H01L 23/373; H01L 23/367; H01L
23/3733; H01L 23/3735; H01L 23/3736;
H01L 23/42

See application file for complete search history.

(56) References Cited

U.S. PATENT DOCUMENTS

| | | | |
|---|---|---|---|
| 2002/0011484 A1* | 1/2002 | Beetz ................... | H05B 1/0236 219/202 |
| 2006/0258055 A1 | 11/2006 | Okamoto ..................... | 438/124 |
| 2012/0074568 A1 | 3/2012 | Eichinger .................... | 257/741 |
| 2012/0134115 A1 | 5/2012 | Schulz-Harder .............. | 361/720 |
| 2012/0287581 A1* | 11/2012 | Sauerbier ............ | H05K 1/0206 361/720 |
| 2020/0083140 A1* | 3/2020 | Kondo ................ | H01L 23/3731 |
| 2020/0178382 A1* | 6/2020 | Koike .................. | H05B 1/0213 |

OTHER PUBLICATIONS

Search Report for International Application No. PCT/EP2021/051899, 12 pages, May 4, 2021.

Search Report for EP Application No. 20182203.8, 9 pages, Dec. 7, 2020.

Elakkiya, R. et al: "Reliability Enhancement of a Power Semiconductor With Optimized Solder Layer Thickness"; IEEE Transactions On Power Electronics; Institute of Electrical and Electronics Engineers; USA; vol. 35, Nr. 6; pp. 6397-6404; XP011774628; ISSN: 0885-8993; DOI: 10.1109/TPEL.2019.2951815; Nov. 9, 2019.

* cited by examiner

ELECTRONIC MODULE, METHOD FOR PRODUCING AN ELECTRONIC MODULE, AND INDUSTRIAL PLANT

CROSS-REFERENCE TO RELATED APPLICATIONS

This application is a U.S. National Stage Application of International Application No. PCT/EP2021/051899 filed Jan. 28, 2021, which designates the United States of America, and claims priority to EP Patent No. 20182203.8 filed Jun. 25, 2020 and DE Application No. 10 2020 202 607.6 filed Feb. 28, 2020, the contents of which are hereby incorporated by reference in their entirety.

TECHNICAL FIELD

The present disclosure relates to electronics. Various embodiments include an electronic module, a method for producing an electronic module, and an industrial plant.

BACKGROUND

Industrial plants with motors or generators usually include control devices for controlling the motors or generators. Such control devices regularly have electronic modules in the form of power modules which contain some of the control electronics of such control devices. In such electronic modules, semiconductor elements such as IGBTs or MOSFETs or FJETs or diodes or semiconductor chips with one or more of the aforementioned components are regularly applied to organic or ceramic circuit carriers, for instance circuit carriers in the form of PCBs ("printed circuit boards") or DBC substrates ("direct copper bonded") or AMB substrates ("active metal brazed").

The semiconductor elements are electrically connected to one another via electric conductor paths, which are for instance formed with copper and/or aluminum. However, the coefficients of thermal expansion of the electric conductor paths regularly differ from the coefficients of thermal expansion of the material of the circuit carriers by orders of magnitude. Hence thermal load changes cause high mechanical stresses in the boundary layer between conductor path and circuit carrier, resulting in delamination or conchoidal fractures. Hence conductor paths in power modules typically have maximum conductor path thicknesses of up to 0.8 mm.

As an alternative, thick copper substrates with special force-absorbing insulation materials (polyimides) or low-expansion materials (epoxy offset with ceramic particles) are known, such that copper thicknesses of more than 2 millimeters can also be achieved. By means of such thick copper substrates with the aforementioned copper thicknesses a high heat spread can be achieved and consequently a high level of robustness against load changes.

To achieve a metal structuring, the metal is milled or etched. However, this is time-consuming and expensive. Thus thick copper substrates are structured by means of photostructurable paint or films during etching. In this case an etching medium can only attack at open points in the paints or films and etch the thick copper. However, a disadvantage of this is the long etching times of many minutes to hours, in order to etch several millimeters of metal. Moreover, etching undercuts arise, which in operation can result in local increases in potential and thus in some cases in electric breakdowns. Hence etching is not cost-effective for very thick metal layers of more than one millimeter. Moreover, in wet chemical etching the necessary safety can only be ensured at great cost.

To speed up etching times and on the other hand to prevent the etching undercuts, prestructuring can take place by means of milling: for example, 1.9 millimeters of a two-millimeter-thick copper film to be removed are removed by means of milling and only the remaining 0.1 mm is removed by means of etching. However, the use of different process methods to produce the substrate means an extended production time, which is further extended because of additionally required cleaning s after the milling, for instance for the removal of oil or particles.

SUMMARY

The teachings of the present disclosure may provide improved electronic modules with thick film substrates which in particular are simple and inexpensive to produce and which can easily be adapted with a view to structuring. For example, some embodiments include an electronic module, in particular a power module, with a circuit carrier which has at least one electrically conductive thick film (20) with at least a thickness of at least 0.5 millimeter, at least 2 millimeters, or at least 4 millimeters, which has a plurality of thermally conductive elements (60) connected to one another, which by means of a thermally conductive material (70) are connected to one another, in particular by material bonding, and in which the thermally conductive elements (60) have a base area (80) with threefold and/or fourfold and/or sixfold rotational symmetry.

In some embodiments, the thermally conductive elements (60) are connected to one another, by being connected to one another by means of a solder (70) and/or by means of an adhesive and/or by means of a sinter connection.

In some embodiments, the thermally conductive material (70) has a thermal conductivity of at least 20 mW/mK, at least 30 W/mK, or at least 35 W/mK.

In some embodiments, the thermally conductive material (70) has a maximum thickness of 100 micrometers, a maximum of 50 micrometers, or a maximum of 30 micrometers.

In some embodiments, the thick film (20) has a surface and the thermally conductive elements (60) form the surface in a non-planar manner, e.g., in a tiered and/or structured manner.

In some embodiments, the thermally conductive elements (60) are formed with a material other than the electrically conductive material (70).

In some embodiments, the thermally conductive elements (60) are formed with a metal, in particular copper and/or aluminum and/or molybdenum, and/or a non-metal, in particular an electrically conductive polymer.

In some embodiments, the thermally conductive elements (60) have a triangular and/or quadrilateral and/or hexagonal base area (80).

As another example, some embodiments include a method for producing an electronic module (10) as described herein, in which the thermally conductive elements (60) are arranged and are connected to one another by means of a thermally conductive material (70) and in which such thermally conductive elements (60) are used, which are coated with the thermally conductive material (70) in the form of a solder, wherein the thermally conductive elements (60) are arranged and then the thermally conductive material (70) is remelted.

As another example, some embodiments include an industrial plant with a control device (S), in particular for controlling a motor (M) and/or generator of the industrial plant (I), which comprises at least one electronic module (10) as described herein.

BRIEF DESCRIPTION OF THE DRAWINGS

The teachings herein are explained in greater detail below on the basis of an exemplary embodiment illustrated in the drawings, in which.

DETAILED DESCRIPTION

Figure 1:
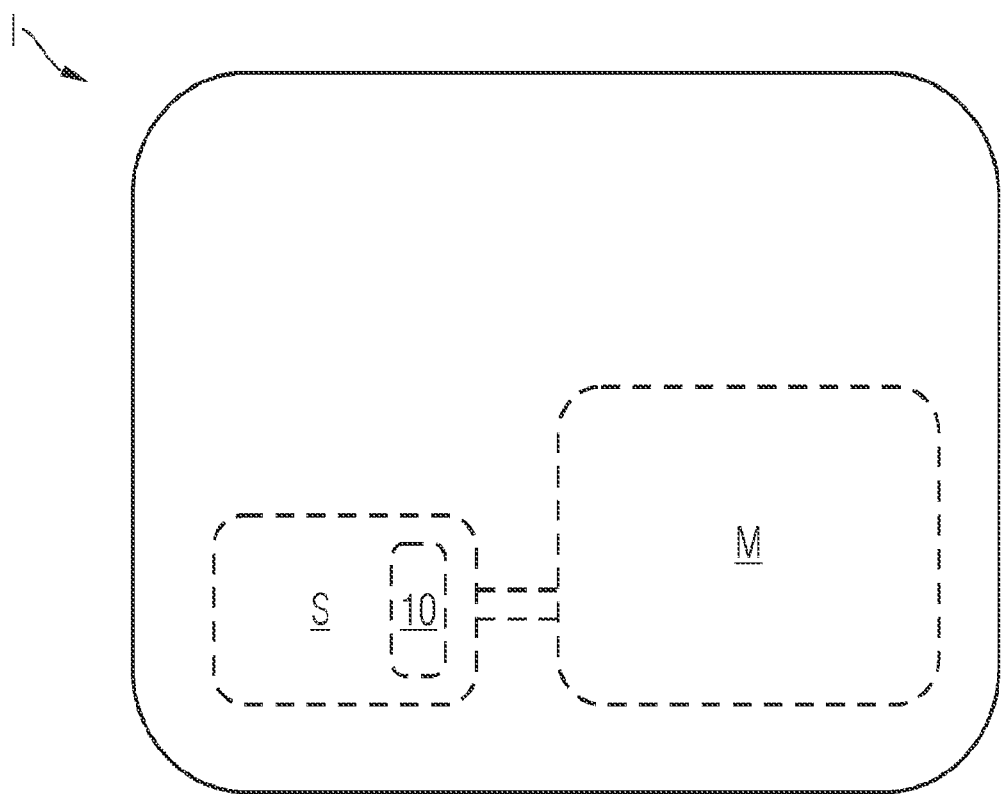
FIG. 1 shows a schematic sketch of an industrial plant with a motor and a motor controller with a power module incorporating teachings of the present disclosure.
Figure 2:
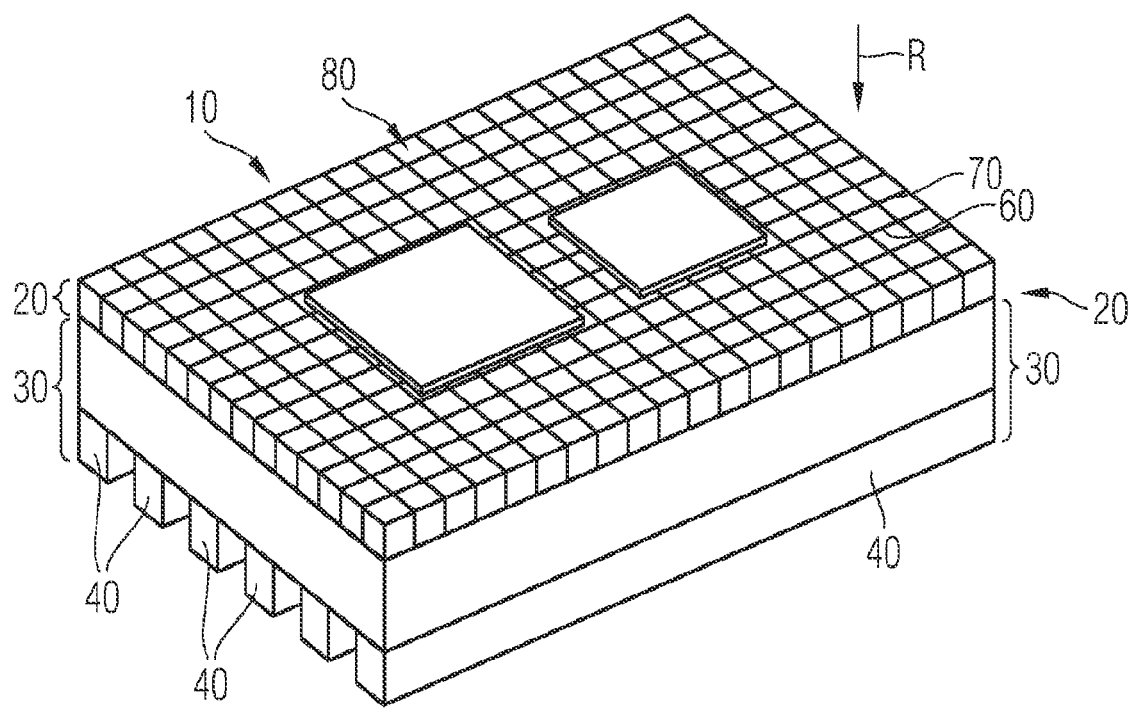
FIG. 2 shows an electronic module incorporating teachings of the present disclosure schematically in a perspective illustration.

The electronic modules described herein include a power module and have a circuit carrier which has at least one thermally conductive thick film with at least a thickness of at least 0.5 millimeter, at least 2 millimeters, or at least 4 millimeters. The thermally conductive thick film may have a plurality of thermally conductive elements connected to one another, e.g., materially-bonded, by means of a thermally conductive material.

The thick film with a thickness of at least 0.5 millimeter permits an efficient heat dissipation of heat-emitting electric components, in particular power components. In consequence of the thickness of the thick film a lateral thermal conductivity and consequently a high heat spread is possible. Implementing the thick film by means of thermally conductive elements permits an especially flexible structure of a thick film of an electronic module. In contrast to thick films produced using etching techniques, the thick film of the electronic module can be produced without undercuts.

By thermally conductive elements within the meaning of this disclosure is meant elements, the material of which at normal pressure and room temperature has a thermal conductivity of at least 1 W/mK, at least 8 W/mK, or at least 15 W/mK. By a thermally conductive material within the meaning of this disclosure is meant a material which at normal pressure and room temperature has a thermal conductivity of at least 1 W/mK, at least 8 W/mK, or at least 15 W/mK.

In some embodiments, the thermally conductive elements may be electrically conductive elements. The thermally conductive material may be electrically conductive material. By electrically conductive is meant an element or material within the meaning of this disclosure when the electrical conductivity at normal pressure and room temperature is at least $10^4$ S/m, at least $10^5$ S/m, or at least $10^6$ S/m. In the case of a large number of materials, a high thermal conductivity correlates with a high electrical conductivity, such that a high electrical conductivity regularly presupposes a high thermal conductivity.

In some embodiments, the thermal path between the thermally conductive elements is completed with the thermally conductive material. It has been shown that the circuit carrier, in particular in the case of electrically conductive elements made of copper and in particular with a thickness of the thermally conductive material between the thermally conductive elements of 20 μm and maybe a thermal conductivity of the thermally conductive material of 40 W/mK, has virtually identical overall thermal properties as a thick film which is similarly dimensioned and manufactured from a single block.

In some embodiments, the thermally conductive elements may be connected to one another by means of a thermally conductive material in the form of an adhesive and/or of a solder and/or the conductive elements are connected to one another by means of a sinter connection. Using the aforementioned alternatives, material-bonded connection of the thermally conductive elements can be achieved simply and inexpensively.

In some embodiments, the thermally conductive material has a thermal conductivity of at least 20 mW/mK, of at least 30 W/mK, or of at least 35 W/mK. With a thermal conductivity such as this the thick film formed with this thermally conductive material, in the case in particular of thermally conductive elements in the form of metal elements, has thermal spread properties comparable to those of a thick film which is similarly dimensioned and manufactured from a single block.

In some embodiments, the thermally conductive material has a maximum thickness of 100 micrometers, a maximum of 50 micrometers, or a maximum of 30 micrometers.

In some embodiments, the thick film has a surface and the thermally conductive elements form the surface in a non-planar manner, e.g. in a tiered and/or structured manner. In this way requirements for an electric circuit, which the circuit carrier carries, can already be taken into account during the arrangement of the thermally conductive elements. In this way a subsequent complex subtractive processing of the thick film can be dispensed with, since the spatial requirements have already been taken into account during the production of the thick film itself.

In some embodiments, the thermally conductive elements are expediently formed with a material other than the thermally conductive material. The thick film is formed heterogeneously as regards its material. In this way for instance the electrically conductive material can be selected with a view to especially good material-bonding connection properties, with a view to process engineering manageability or process flexibility or process precision, whereas the elements, which form the overwhelming proportion by volume of the thick film, can for instance be selected solely with a view to the thermal properties or with a view to the material costs.

In some embodiments, the thermally conductive elements may be formed with a metal, in particular copper and/or aluminum and/or molybdenum, and/or a non-metal, in particular a thermally conductive polymer. Such thermally conductive elements may be inexpensive and easy to manufacture, such that the electronic module can be produced easily and conveniently.

In some embodiments, the thermally conductive elements each have a base area with threefold and/or fourfold and/or sixfold symmetry. In this development, a thick film can be tiled so as to be expanded in any way and unbroken in its flat extension directions, i.e. in directions transverse, in particular perpendicular, to the thickness of the thick film.

In some embodiments, the thermally conductive elements each have a triangular and/or quadrangular and/or hexagonal base area. In this way edges of the thick film can in particular be easily realized.

In some embodiments, the electronic module has thermally conductive elements which do not have just one of the aforementioned base areas. In this way the thermally conductive elements can be arranged spatially in respect of one another, such that predefined geometric requirements for the thick film of the inventive electronic module can be realized without any subtractive reprocessing of the thick film.

In some embodiments, a method for producing an electronic module as described above the electrically conductive elements are arranged and connected to one another by means of the electrically conductive material. By means of the methods herein, the advantages already explained in greater detail for the electronic module can be achieved. In particular, by means of the methods herein an electronic module can be produced particularly simply and inexpensively.

In some embodiments, thermally conductive elements are used which are coated with a thermally conductive material in the form of a solder, wherein the thermally conductive elements are arranged and subsequently the thermally conductive material is remelted. In some embodiments, conductive material can be introduced particularly easily between the thermally conductive elements.

In some embodiments, the thermally conductive elements are provided by being manufactured subtractively, e.g. by means of sawing and/or stamping techniques and/or cutting methods, in particular laser cutting and/or water jet cutting. The cited subtractive manufacturing methods are established manufacturing methods, by means of which the thermally conductive elements can be produced with easily predictable costs and/or tolerances and/or expenditure of time.

In some embodiments, the industrial plant has a control device, in particular for controlling a motor and/or generator of the industrial plant. The control device of the industrial plant comprises at least one electronic module as described herein. Because the electronic modules described herein are easy to manufacture, the industrial plant can likewise easily be produced. Because the thick film of the electronic module is significantly easier to manufacture compared to the prior art, this opens the way to adapting the industrial plant inexpensively to geometric requirements of the electric circuit.

The industrial plant I illustrated schematically in FIG. 1 is an industrial motor, which comprises an electric machine M in the form of an electric motor, as well as a motor controller S. The motor controller S has an electronic module 10 in the form of a power module. In principle, the industrial plant I can be any other industrial plant with at least one electronic module 10 in further exemplary embodiments not illustrated separately.

The electronic module 10 comprises a thick film substrate 20 which is designed as a substantially cuboid flat component and which is fastened by one of its two flat sides to a heat sink 30. The heat sink 30 has cooling fins 40 on its side facing away from the thick film substrate 20. Arranged on its flat side facing away from the heat sink 30 on the thick film substrate 20 are power semiconductors 50 in the form of IGBT transistors (IGBT="Insulated Gate Bipolar Transistor").

In some embodiments, the thick film substrate 20 is formed by metal, here copper, with a percentage by weight of more than 50 percent, in the exemplary embodiment illustrated of more than 98 percent. The thick film substrate 20 may be formed with individual metal elements 60, in the exemplary embodiment illustrated copper elements. To this end the metal elements 60 are arranged adjacent to one another in directions perpendicular to the least expansion R of the thick film substrate 20, in other words in flat directions of the thick film substrate 20.

In the exemplary embodiment illustrated the metal elements 60 have a cuboid shape, here specifically a cubiform shape. The metal elements 60 are fastened to one another using material bonding with a thermally conductive solder 70 on the sides facing one another in flat directions of the thick copper substrate 20. To this end, in the exemplary embodiment illustrated, the solder 70 is present with a thickness between the metal elements 60, in other words a thickness in flat directions of the thick film substrate 20, of 20 micrometers. In further exemplary embodiments, the thickness may also differ and preferably has a maximum thickness of 100 micrometers, for example 80 micrometers or 40 micrometers. In the exemplary embodiment illustrated, the solder 70 is formed with a metal which has a lower melting point than that of the metal of the metal elements 60, in the exemplary embodiment shown with tin, wherein other solders 70 can in principle also come into consideration.

In some embodiments, the place of the metal elements 60 formed with copper can also be taken by metal elements 60 formed with another metal, for instance aluminum and/or molybdenum. In some embodiments, the place of the thermally conductive metal elements 60 can also be taken by thermally conductive polymer elements made of a thermally conductive polymer.

Instead of or in addition to a solder connection of the metal elements 60 to one another, a material-bonded connection of the metal elements 60 to one another by means of a thermally conductive adhesive and/or by means of a sinter connection may exist in further exemplary embodiments not illustrated separately.

In the exemplary embodiment illustrated, the solder 70 has a thermal conductivity of at least 20 W/mK. In some embodiments, the thermal conductivity can be 30 W/mK or 35 W/mK. The same values apply in the exemplary embodiments mentioned above for the thermal conductivity of the adhesive or of the sinter connection.

In the exemplary embodiment illustrated, the metal elements 60 are arranged such that the metal elements 60 form a surface flush-mounted in a common plane with one another. In some embodiments, the metal elements 60 are offset to one another in the thickness direction of the thick film substrate 20, in other words in the direction R of the least thickness of the thick film substrate 20, or are formed with a thickness differing from one another, such that the thick film substrate 20 has a tiered surface at a distance from the heat sink 30, wherein individual metal elements 60 form tiers of the tiered surface.

In the exemplary embodiment illustrated, the metal elements 60 have a fourfold rotational symmetry in consequence of their cubiform shape. In some embodiments, the metal elements 60 have a twofold symmetry and/or a threefold and/or sixfold symmetry. In this case the metal elements 60 in particular have a base area 80, e.g., a surface oriented transversely, in particular perpendicularly, to the direction R of the thickness of the thick film substrate 20, for example with a quadrilateral and/or triangular and/or hexagonal shape. In the exemplary embodiment illustrated, squares form the base area 80 of the metal elements 60.

In some embodiments, the metal elements 60 are manufactured subtractively from bulk material, here a copper block, for example by means of sawing, by means of stamping techniques or by means of cutting methods such as laser cutting or water jet cutting. Then the metal elements 60 are arranged, for example by means of conventional placement technologies used for the placement of PCBs and substrates. In this case the metal elements 60 are for example arranged in a spatial arrangement to one another such that in the direction R of the thickness of the thick film substrate 20 the desired structuring is established by means of the respective height of the metal elements 60 of the thick film substrate 20.

The solder 70 is for example introduced between the metal elements 60 such that prior to being arranged the metal elements 60 are already coated with a layer of solder material and the layers of solder material are remelted after the arrangement of the metal elements 60.

What is claimed is:

1. An electronic module comprising:
   a circuit carrier comprising an electrically conductive thick film with a thickness of at least 0.5 millimeter;
   a plurality of thermally conductive elements connected to the thick film and materially bonded to one another by a thermally conductive material;
   wherein the thermally conductive elements have a base area with rotational symmetry.

2. The electronic module as claimed in claim 1, wherein the thermally conductive elements are connected to one another by a solder and/or an adhesive and/or a sinter connection.

3. The electronic module as claimed in claim 1, in which the thermally conductive material has a thermal conductivity of at least 20 mW/mK.

4. The electronic module as claimed in claim 1, wherein the thermally conductive material has a maximum thickness of 100 micrometers.

5. The electronic module as claimed in claim 1, wherein:
   the thick film has a surface; and
   the thermally conductive elements form the surface in a non-planar manner.

6. The electronic module as claimed in claim 1, wherein the thermally conductive elements are formed with a material other than the electrically conductive material.

7. The electronic module as claimed in claim 1, wherein the thermally conductive elements comprise a metal.

8. A method for producing an electronic module, the method comprising:
   connecting thermally conductive elements to a circuit carrier comprising a thick film;
   materially bonding the thermally conductive elements to one another with a thermally conductive material;
   coating the thermally conductive material with a solder; and
   remelting the thermally conductive material.

9. An industrial plant comprising:
   a control device for controlling a motor and/or generator;
   the control device including a circuit carrier comprising an electrically conductive thick film with a thickness of at least 0.5 millimeter and a plurality of thermally conductive elements connected to the thick film and to materially bonded to one another by a thermally conductive material;
   wherein the thermally conductive elements have a base area with rotational symmetry.

* * * * *